United States Patent
Park et al.

(10) Patent No.: US 10,657,043 B2
(45) Date of Patent: May 19, 2020

(54) POWER-SUPPLY DEVICE AND ELECTRONIC DEVICE INCLUDING THE SAME

(71) Applicant: SK hynix Inc., Icheon (KR)

(72) Inventors: Jeong Su Park, Suwon (KR); Yong Seok Oh, Yongin (KR); Joo Il Lee, Seoul (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/217,912

(22) Filed: Dec. 12, 2018

(65) Prior Publication Data

US 2020/0004675 A1 Jan. 2, 2020

(30) Foreign Application Priority Data

Jun. 27, 2018 (KR) ................. 10-2018-0073762

(51) Int. Cl.
*G06F 12/02* (2006.01)
*G06F 3/06* (2006.01)
*G11C 16/26* (2006.01)
*G11C 16/30* (2006.01)
*G06F 1/28* (2006.01)

(52) U.S. Cl.
CPC ........ *G06F 12/0246* (2013.01); *G06F 3/0614* (2013.01); *G11C 16/26* (2013.01); *G11C 16/30* (2013.01); *G06F 1/28* (2013.01); *G06F 2212/7201* (2013.01)

(58) Field of Classification Search
CPC ... G06F 12/0246; G06F 3/0614; G11C 16/26; G11C 16/30
See application file for complete search history.

(56) References Cited

U.S. PATENT DOCUMENTS

| | | | | |
|---|---|---|---|---|
| 9,013,944 | B2* | 4/2015 | Jeon | G11C 5/141 365/226 |
| 9,484,069 | B2* | 11/2016 | Shim | G11C 5/141 |
| 9,742,220 | B2* | 8/2017 | Jeon | H02J 9/061 |
| 2016/0154594 | A1 | 6/2016 | Kang | |
| 2016/0232086 | A1* | 8/2016 | Lee | G06F 12/0246 |
| 2017/0067968 | A1* | 3/2017 | Lee | G01R 31/40 |

FOREIGN PATENT DOCUMENTS

KR 1020160064364 A 6/2016
KR 1020170128012 A 11/2017

* cited by examiner

*Primary Examiner* — Tri M Hoang (57) ABSTRACT

A power-supply device and an electronic device including the relate to technology for a data storage device. The electronic device includes a power-supply device and a controller. The power-supply device generates a sudden power loss (SPL) detection signal in a sudden power off (SPO) state by detecting a level of an external power, generates a charging sense signal indicative of a charging capacity of an auxiliary power-supply circuit, divides the charging capacity into a plurality of charging levels, detects a level of the charging capacity, and generates a charging sense signal indicating a charging level of the auxiliary power-supply circuit in response to the detected charging level. The controller stores flushing information in at least one non-volatile memory device when the SPL detection signal is activated, and variably adjust an amount of storage in the non-volatile memory device in response to the charging sense signal.

20 Claims, 5 Drawing Sheets

POWER-SUPPLY DEVICE AND ELECTRONIC DEVICE INCLUDING THE SAME

CROSS-REFERENCE TO RELATED APPLICATION

This application claims priority based upon Korean patent application No. 10-2018-0073762, filed on Jun. 27, 2018, the disclosure of which is hereby incorporated in its entirety by reference herein.

BACKGROUND

1. Technical Field

Embodiments of the present disclosure may generally relate to a power-supply device and an electronic device including the same, and more particularly to a technology for a data storage device.

2. Related Art

In a recent computing environment, ubiquitous computing which enables users to use computer systems at anytime and anywhere has become prevalent. Users of mobile electronic devices such as mobile phones, digital cameras, laptops, etc. are rapidly increasing. Generally, each of the mobile electronic devices has been designed to use a data storage device including a memory device. The data storage device has been used to store data for use in the mobile electronic device.

Since the data storage device does not have a mechanical driver, the data storage device has high stability and high durability, enables information stored therein to be accessed at a high speed, and has low power consumption. The data storage device having the above-mentioned advantages may include a Universal Serial Bus (USB) memory device, a memory card having various interfaces, a Universal Flash Storage (UFS) device, and a Solid State Drive (SSD).

BRIEF SUMMARY OF THE INVENTION

Various embodiments of the present disclosure are directed to providing a power-supply device and an electronic device including the same that substantially address one or more issues due to limitations and disadvantages of the related art.

Embodiments of the present disclosure relate to an electronic device for guaranteeing operation reliability by variably changing a data storage unit according to an amount of electric charges stored in an auxiliary power-supply circuit.

In accordance with an embodiment of the present disclosure, a power-supply device includes an auxiliary power-supply circuit, a level detection circuit, and a power-supply controller. The auxiliary power-supply circuit generates a signal indicative of a charging capacity. The level detection circuit divides the charging capacity of the auxiliary power-supply circuit into a plurality of charging levels, detects a level of the charging capacity among the plurality of charging levels, and generates a charging level detection signal corresponding to the detected charging level. The power-supply controller generates an internal voltage and a charge power-supply voltage in response to an external power, detects a level of the external power, generates a sudden power loss (SPL) detection signal in a sudden power off (SPO) state using the detected level of the external power, and outputs a charging sense signal indicating a charging level of the auxiliary power-supply circuit in response to the charging level detection signal.

In accordance with another embodiment of the present disclosure, an electronic device includes a power-supply device and a controller. The power-supply device generates a sudden power loss (SPL) detection signal in a sudden power off (SPO) state by detecting a level of an external power generate a charging sense signal indicative of a charging capacity of an auxiliary power-supply circuit, divides the charging capacity into a plurality of charging levels, detects a level of the charging capacity, and generates a charging sense signal indicating a charging level of the auxiliary power-supply circuit in response to the detected charging level. The controller stores flushing information in at least one non-volatile memory device when the SPL detection signal is activated, and variably adjusts an amount of storage in the non-volatile memory device in response to the charging sense signal.

It is to be understood that both the foregoing general description and the following detailed description of the present disclosure are explanatory and are intended to provide further explanation of the disclosure as claimed.

BRIEF DESCRIPTION OF THE DRAWINGS

The above and other features and beneficial aspects of embodiments of the present disclosure will become apparent with reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. The same reference numbers may be used throughout the drawings to refer to the same or like portions.

Figure 1:
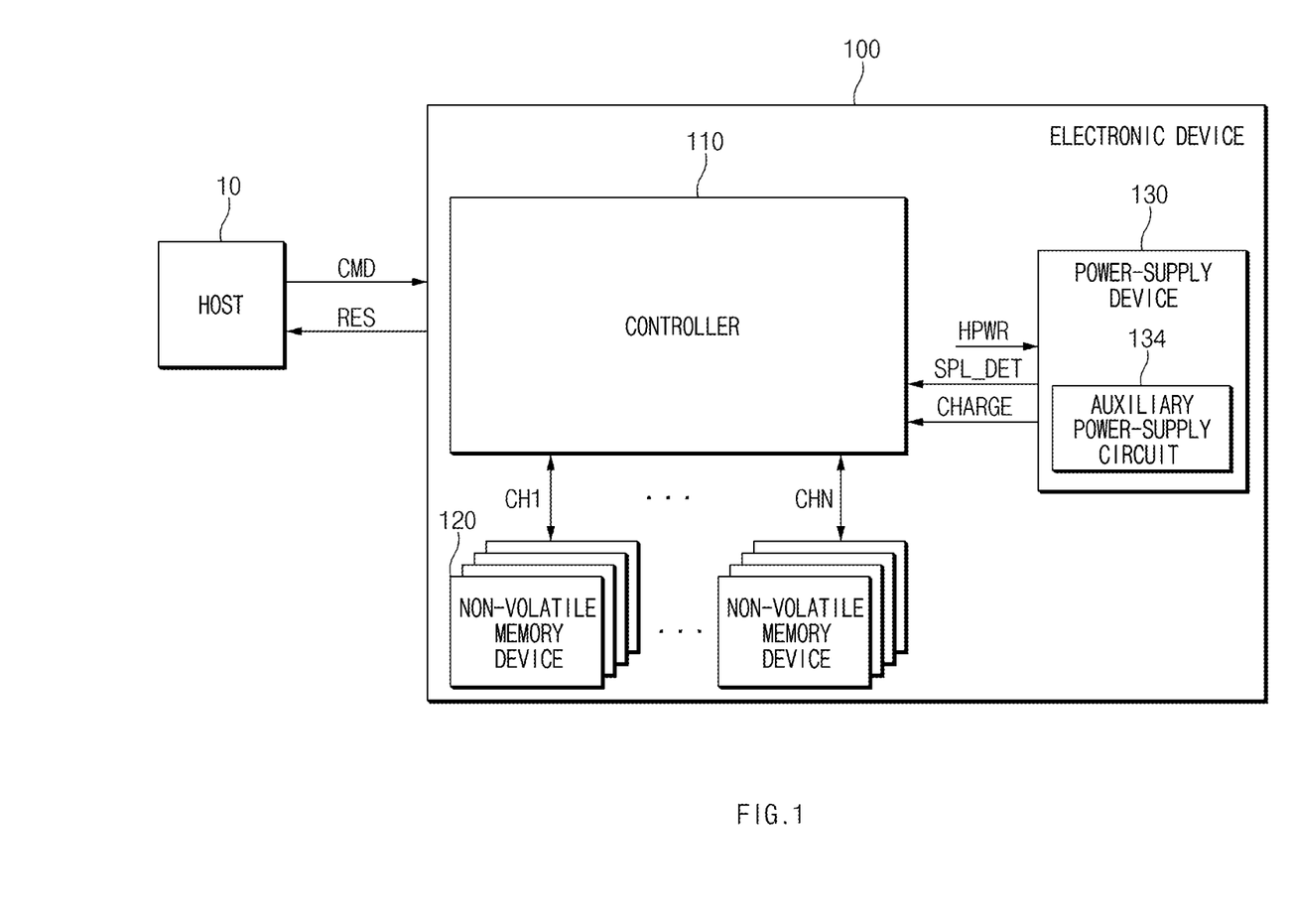
FIG. 1 illustrates an electronic device according to an embodiment of the present disclosure.

FIG. 1 illustrates an electronic device 100 according to an embodiment of the present disclosure.

Referring to FIG. 1, the electronic device 100 according to an embodiment of the present disclosure may include a controller 110, a plurality of non-volatile memory devices 120, and a power-supply device 130.

The electronic device 100 may provide data in response to a request from a host 10. For example, the electronic device 100 may read stored data and provide the read data to the host 10.

The controller 110 may control overall operation of the electronic device 100. The controller 110 may transmit and receive signals to and from the host 10 located outside. Here, the term "signal" may include a command signal, an address, data, etc.

For example, the controller 110 may analyze and process a command signal CMD received from the host 10. In this case, the command signal CMD may include a write command for writing data in the electronic device 100, a read command for reading data stored in the electronic device 100, etc.

Upon receiving the command signal CMD, the controller 110 may control operations of background functional blocks according to firmware or software for driving the electronic device 100. The controller 110 may process operations of the electronic device 100 in response to the command signal CMD, and may transmit a response signal RES in response to the processed result to the host 10. The controller 110 may control one or more of the plurality of non-volatile memory devices 120 to execute a command (e.g., a data read command or a data write command) received from the host 10.

The plurality of non-volatile memory devices 120 may be used as storage media of the electronic device 100. The non-volatile memory devices 120 may be coupled to the controller 110 through a plurality of channels CH1 to CHN. In an embodiment, one or more non-volatile memory devices 120 may be coupled to a single channel. When two or more non-volatile memory devices 120 are coupled to the single channel, these non-volatile memory devices 120 may be coupled to a common signal bus and a common data bus.

The power-supply device 130 may receive external power (e.g., a power-supply voltage) HPWR from an external part, generate one or more internal voltages based on the power-supply voltage HPWR, and provide the generated internal voltages to one or more components of the electronic device 100. In an embodiment, the power-supply device 130 may include a Power Management Integrated Circuit (PMIC).

The power-supply device 130 may detect a level of the power-supply voltage HPWR. When the power-supply device 130 detects an occurrence of Sudden Power Off (SPO) based on the detected level of the power-supply voltage HPWR, the power-supply device 130 may activate (or assert) a sudden power loss detection signal SPL_DET, and may output the activated sudden power loss detection signal SPL_DET to the controller 110.

Power-supply errors may occur during an operation of the electronic device 100. For example, when the power-supply device 130 does not operate normally in an unexpected situation (e.g., a power outage), the non-volatile memory devices 120 may be powered off, which will hereinafter be referred to as the SPO. The power-supply device 130 may include various types of power-supply circuits, for example, a DC power source, an AC power source, a charging battery, a power converter, etc.

The power-supply device 130 may include an auxiliary power-supply circuit 134. If SPO occurs, the power-supply device 130 including the auxiliary power-supply circuit 134 may provide a power-supply voltage to cause the electronic device 100 to stop in a predetermined manner.

That is, when an unexpected power-supply error occurs during an operation of a memory system, SPO indicating sudden power loss may occur. If the SPO occurs, the electronic device 100 may be driven by auxiliary power stored in the auxiliary power-supply circuit 134 whereas external power (e.g., the power-supply voltage HPWR) is not supplied. During a time period in which the electronic device 100 is driven by the auxiliary power-supply circuit 134, the controller 110 may transfer information for system recovery to the non-volatile memory devices 120. After transferring data indicative of the information for system recovery into the non-volatile memory devices 120, the controller 110 may stop supplying internal power and stop performing operations.

The power-supply device 130 according to an embodiment of the present disclosure may divide a maximum charging capacity of the auxiliary power-supply circuit 134 into a given number (e.g., N that is an integer equal to or greater than 2) of charging units (or charging levels), monitor the N charging units, and output a charging sense signal CHARGE indicating the charging capacity of the auxiliary power-supply circuit 134 to the controller 110. For example, the power-supply device 130 may detect charged energy in the auxiliary power-supply circuit 134, select one of predetermined N charging levels corresponding to a ratio of the charged energy over the maximum charged energy of the auxiliary power-supply circuit 134, and generate the charging sense signal CHARGE indicative of the ratio. In addition, the controller 110 may variably adjust a storage unit of the non-volatile memory devices 120 in response to the charging sense signal CHARGE. Specifically, the controller 110 may adjust an amount of storage in one or more of the non-volatile memory devices 120 by a given unit in response to the charging sense signal CHARGE. The controller 110 may generate a response signal RES in response to the charging sense signal CHARGE and transmit the response signal RES to the host 10.

The host 10 may be implemented on a board such as a printed circuit board (PCB). Although not shown in FIG. 1, the host may include one or more background function blocks for generating and processing control signals. The host 10 may include a connection terminal (not shown) for transmitting and receiving signals to and from the electronic device 100, and such a connection terminal may be, for example, a socket, a slot, or a connector. The electronic device 100 may be mounted to the connection terminal of the host 10. Signals (for example, a command, an address, data, etc.) and power may be communicated between the host 10 and the electronic device 100 through the connection terminal. The connection terminal may be implemented in various ways according to an interfacing method between the host 10 and the electronic device 100.

According to the above-described embodiments of the present disclosure, the charging capacity of the auxiliary power-supply circuit 134 may be monitored by the power-supply device 130. In an embodiment, the power-supply device 130 may monitor an amount of currently stored energy in the auxiliary power-supply circuit 134. The controller 110 may control a portion of the plurality of non-volatile memory devices 120 in response to the charging sense signal CHARGE.

The electronic device 100 according to an embodiment of the present disclosure may be applied to a solid state drive (SSD) in which a storage medium for storing data is implemented as a flash memory device. However, embodiments of the present disclosure are not limited thereto.

For example, the electronic device 100 according to another embodiment of the present disclosure may be implemented as any one of various storage devices, for example, a Multi Media Card (MMC), an Embedded MMC (eMMC), a Reduced Size MMC (RS-MMC), a micro-MMC, a Secure Digital (SD) card, a mini Secure Digital (mini-SD) card, a micro Secure Digital (micro-SD) card, a Universal Serial Bus (USB) memory, a Universal Flash Storage (UFS) device, a Personal Computer Memory Card International Association (PCMCIA) card-type memory, a Peripheral Component Interconnection (PCI) card-type memory, a PCI-express (PCI-E) card-type memory, a Compact Flash (CF) card, a Smart Media (SM) card, a memory stick, etc.

In addition, the electronic device 100 according to still another embodiment of the present disclosure may be implemented as any one of various kinds of packages, for example, a Package On Package (POP), a System In Package (SIP), a System On Chip (SOC), a Multi-Chip Package (MCP), a Chip On Board (COB), a wafer-level fabricated package (WFP), a wafer-level stack package (WSP), etc.

Figure 2:
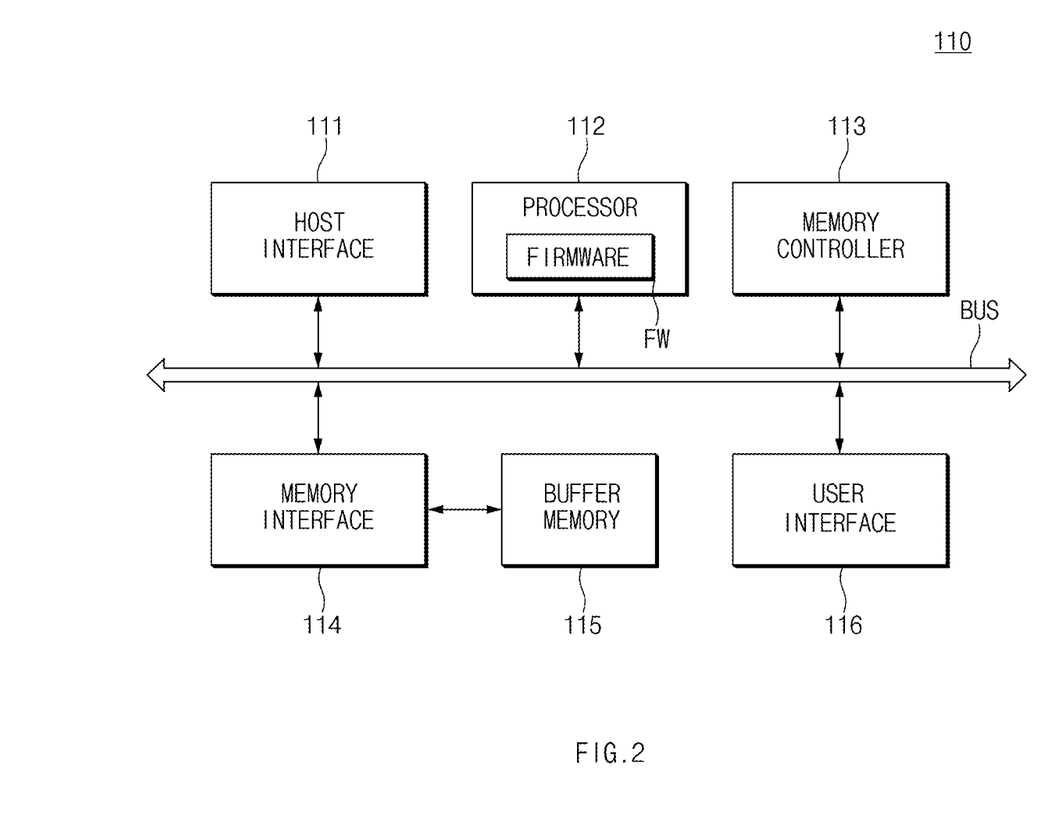
FIG. 2 illustrates a controller shown in FIG. 1 according to an embodiment of the present disclosure.

FIG. 2 illustrates the controller 110 shown in FIG. 1 according to an embodiment.

Referring to FIG. 2, the controller 110 may include a host interface 111, a processor 112, a memory controller 113, a memory interface 114, a buffer memory 115, and a user interface 116. In the embodiment shown in FIG. 2, the host interface 111, the processor 112, the memory controller 113, the memory interface 114, the buffer memory 115, and the user interface 116 may communicate with one another through a bus BUS. The bus BUS may be a path for data communication between constituent elements of the electronic device 100.

The host interface 111 may control interfacing between the external host 10 and the electronic device 100. That is, the host interface 111 may include a data exchange protocol for the host 10 coupled to the electronic device 100, and may couple the electronic device 100 to the host 10. The host interface 111 may be any one of a Serial Advanced Technology Attachment (SATA) interface, a Parallel Advanced Technology Attachment (PATA) interface, a Universal Serial Bus (USB) interface, a Serial Attached Small (SAS) computer system interface, a PCI-express (PCI-E) interface, and a Non-volatile Memory-express (NVMe) interface. However, embodiments of the present disclosure are not limited thereto.

In addition, the processor 112 may analyze an input signal of the electronic device 100, and may process operations based on the analyzed result. Here, the processor 112 may be implemented as a Micro Control Unit (MCU) or a Central Processing Unit (CPU).

The processor 112 may control overall operation of the electronic device 100 using firmware FW for driving the electronic device 100. The processor 112 may execute the firmware FW to control the non-volatile memory devices 120. The processor 112 may temporarily store data, which is generated and updated by executing the firmware FW, in the buffer memory 115.

In an embodiment, the firmware FW may denote software, application, etc. for processing data in response to a user input signal. Although the firmware FW is executed in the processor 112 according to the above-described embodiment of the present disclosure, embodiments of the present disclosure are not limited thereto. For example, firmware (not shown) may be executed in the buffer memory 115 or may also be executed in other blocks as desirable.

Prior to transferring data read from the non-volatile memory devices 120 to the host 10, the processor 112 may temporarily store the read data in the buffer memory 115. In addition, before the host 10 transfers data in response to a write request in the non-volatile memory devices 120, the processor 112 may temporarily store the write request data in the buffer memory 115. In an embodiment, the data (i.e., data to be transferred to the host or data received from the host) may include not only data executed by an application, but also metadata of the host 10 for data management. The processor 112 may transmit a request signal to the power-supply device 130 such that the processor 112 may confirm charging capacity of the auxiliary power-supply circuit 134 using the request signal.

The memory controller 113 may control operations of the non-volatile memory devices 120. The memory controller 113 may transmit and receive commands, addresses, data, etc. to and from the non-volatile memory devices 120. For example, during a write operation, the memory controller 113 may forward signals received from the host interface 111 to the non-volatile memory devices 120, thereby storing data indicated by the forwarded signals in the non-volatile memory devices 120. During a read operation, the memory controller 113 may transmit signals read from the non-volatile memory devices 120 to the host interface 111.

In addition, upon receiving a control signal from the processor 112, the memory interface 114 may write data in the buffer memory 115, or may read data stored in the buffer memory 115. In an embodiment, the memory interface 114 may include a Buffer Allocation Unit (BAU) for managing a buffer, such that the memory interface 114 may manage use and release of the buffer using the Buffer Allocation Unit (BAU).

The buffer memory 115 may be used as a data storage medium of the controller 110. The buffer memory 115 may temporarily store input/output (I/O) data of the controller 110 or the plurality of non-volatile memory devices 120. In an embodiment, the buffer memory 115 may include a memory device such as DRAM or SRAM. Whereas data stored in the buffer memory 115 is lost when the buffer memory 115 is powered off, the memory 115 may operate at a sufficiently high speed to function as a buffer memory. The data temporarily stored in the buffer memory 115 may be transmitted to the host 10 or the plurality of non-volatile memory devices 120 according to a control signal of the controller 110.

The user interface 116 may include an input interface for allowing a user to access the electronic device 100 and an output interface for supplying an operation state or processed results of the electronic device 100 to the user.

Figure 3:
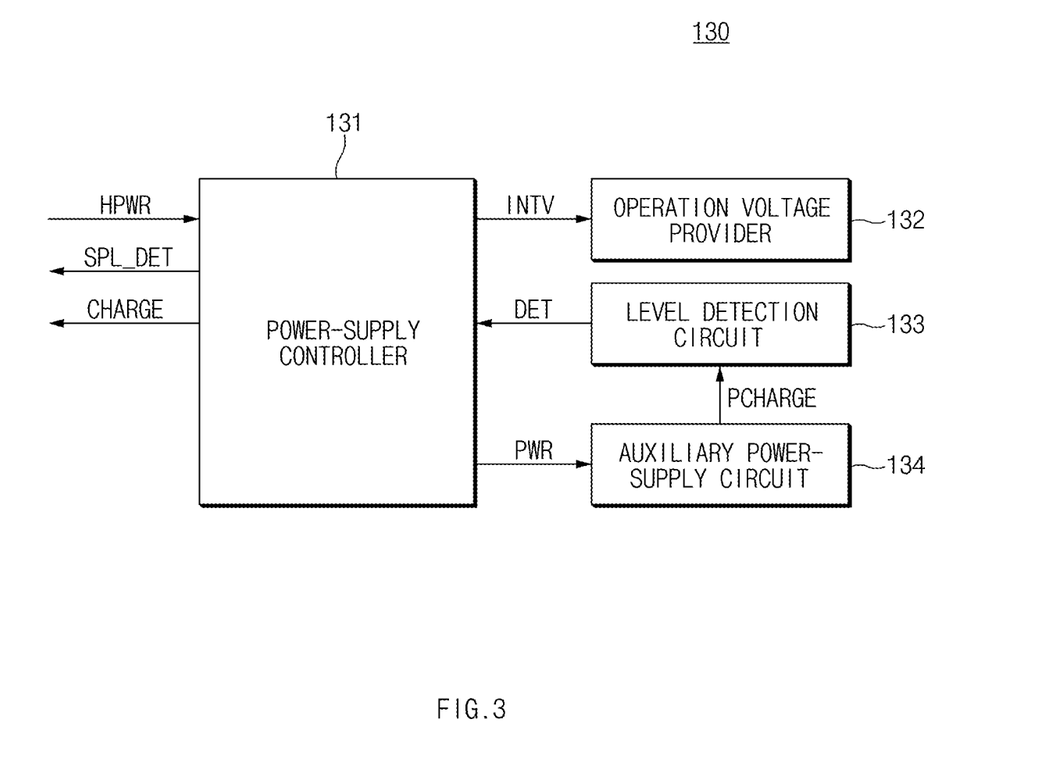
FIG. 3 illustrates a power-supply device shown in FIG. 1 according to an embodiment of the present disclosure.

FIG. 3 illustrates the power-supply device 130 shown in FIG. 1 according to an embodiment.

Referring to FIG. 3, the power-supply device 130 may include a power-supply controller 131, an operation voltage provider 132, a level detection circuit 133, and an auxiliary power-supply circuit 134.

The power-supply controller 131 may control overall operation of the power-supply device 130. For example, the power-supply controller 131 may receive a power-supply voltage (or an external voltage) HPWR, and may convert the received power-supply voltage HPWR into an internal voltage INTV for the electronic device 100. The power-supply voltage HPWR may be supplied from the host 10. In addition, the power-supply controller 131 may receive the power-supply voltage HPWR, and may convert the received power-supply voltage (HPWR) into a charging power-supply voltage PWR to charge the auxiliary power-supply circuit 134.

The power-supply controller 131 may monitor a level of the power-supply voltage HPWR. When the level of the power-supply voltage (HPWR) is lower than a given reference value (e.g., a predetermined voltage level), the power-supply controller 131 may determine an occurrence of interrupt (e.g., SPO), and may generate a detection signal (e.g., a sudden power loss detection signal SPL_DET). In an embodiment, the power-supply controller 131 may provide the sudden power loss detection signal SPL_DET to a processor (e.g., the processor 112 of the controller 110 in FIG. 2).

In addition, the power-supply controller 131 may output a charging sense signal CHARGE indicating a charging level of the auxiliary power-supply circuit 134 to the controller 110 based on the charging level detection signal DET. In an embodiment, the power-supply controller 131 may provide the charging sense signal CHARGE to the processor 112 of the controller 110 in FIG. 2.

The operation voltage provider 132 may receive the internal voltage INTV from the power-supply controller 131, converts the received internal voltage (INTV) into operation voltages having various levels to drive corresponding elements of an electronic device (e.g., the electronic device 100 in FIG. 1). In an embodiment, the operation voltage provider 132 may perform level shifting on the internal voltage INT to generate various levels of voltages for performing programming, erasing, and reading operations of a flash memory. In an embodiment, the operation voltage provider 132 may boost (or step up) a supplied voltage (e.g., the internal voltage INTV) to provide the boosted voltage to one or more elements each using a higher voltage than the supplied voltage, may step down the supplied voltage to provide the stepped-down voltage to one or more elements each using a lower voltage than the supplied voltage, or both.

The level detection circuit 133 may generate a charging level detection signal DET by detecting a level of a charging capacity charged in the auxiliary power-supply circuit 134. Specifically, the level detection circuit 133 may generate the charging level detection signal DET in response to a charging capacity signal PCHARGE indicating a charging capacity of the auxiliary power-supply circuit 134. In an embodiment, the charging capacity indicates the charged (or stored) energy (e.g., in Joules) in one or more capacitive elements of the auxiliary power-supply circuit 134. For example, the level detection circuit 133 may detect the stored energy of the auxiliary power-supply circuit 134 using the following equation: $P=\frac{1}{2}*C*V^2$. In the equation, P may denote the stored energy in the auxiliary power-supply circuit 134, C may denote the capacitance value of the auxiliary power-supply circuit 134, and V may denote the charging voltage of the auxiliary power-supply circuit 134. Although the auxiliary power-supply circuit 134 may detect the charging capacity by measuring the charging voltage of the auxiliary power-supply circuit 134, embodiments of the present disclosure are not limited thereto. In other embodiments, the auxiliary power-supply circuit 134 may calculate the charging capacity by measuring a current value, measuring a discharge time, or both. For example, when the charging capacity indicates a present battery capacity (e.g., in Amp-hrs), the charging capacity is calculated by subtracting a multiplied value of a discharge current (e.g., in Amps) and a discharge time (e.g., in Hours) from the maximum battery capacity (e.g., in Amp-hrs).

While the electronic device 100 performs a given operation, the level detection circuit 133 may detect a value of the charging capacity signal PCHARGE from the auxiliary power-supply circuit 134 at any time or at intervals of a predetermined time. For example, the level detection circuit 133 may detect a value of the charging capacity signal PCHARGE at a plurality of times, a time interval between adjacent ones of the plurality times being predetermined.

The auxiliary power-supply circuit 134 may be charged to store potential energy during a power-up operation or a normal operation of the electronic device 100. When an unexpected power error (e.g., SPO) occurs, the auxiliary power-supply circuit 134 may supply power to the electronic device 100 using the stored energy.

The auxiliary power-supply circuit 134 may include a mass storage capacitor, for example, a supercapacitor. In an embodiment, the supercapacitor may be a power storage device capable of retaining charges with a high capacity, and may store auxiliary power therein. Although the auxiliary power-supply circuit 134 may be implemented using an aluminum electrolytic capacitor or a polymer tantalum capacitor, embodiments of the present disclosure are not limited thereto.

Figure 4:
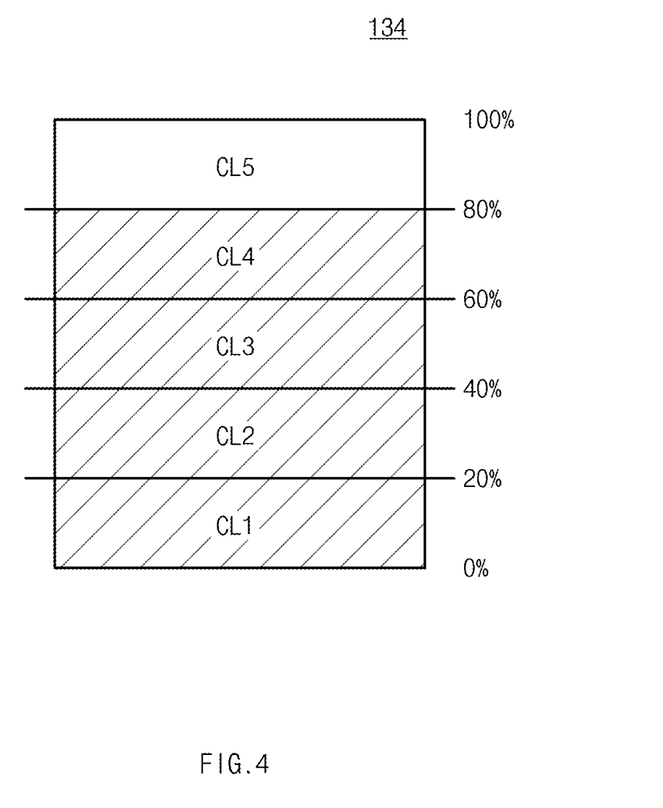
FIG. 4 illustrates operations of an auxiliary power-supply circuit shown in FIG. 1 according to an embodiment of the present disclosure.

FIG. 4 illustrates operations of the auxiliary power-supply circuit 134 shown in FIG. 1 according to an embodiment.

Referring to FIG. 4, the maximum charging capacity (e.g., the maximum stored energy) of the auxiliary power-supply circuit 134 may be divided into a given number N (e.g., 5 in FIG. 4) of units (or levels). For example, a discharge state (or an empty state) of the auxiliary power-supply circuit 134 may be denoted by 0%. The level detection circuit 133 may detect a charging capacity of the auxiliary power-supply circuit 134 as a percentage of a rated capacity (or the maximum capacity). In an embodiment, the level detection circuit 133 may detect a currently stored energy in the auxiliary power-supply circuit 134 as a percentage of the maximum energy that can be stored in the auxiliary power-supply circuit 134. For example, if the auxiliary power-supply circuit 134 is composed of a high-volume capacitor, the rated capacity of the auxiliary power-supply circuit 134 may be represented by a maximum voltage capable of being applied between electrodes of the high-volume capacitor.

The level detection circuit 133 may divide the maximum capacity of the auxiliary power-supply circuit 134 into a first charging level CL1 (equal to or less than 20% of the maximum capacity), a second charging level CL2 (greater than 20% and equal to or less than 40% of the maximum capacity), a third charging level CL3 (greater than 40% and equal to or less than 60% of the maximum capacity), a fourth charging level CL4 (greater than 60% and equal to or less than 80% of the maximum capacity), and a fifth charging level CL5 (greater than 80% and equal to or less than 100% of the maximum capacity), and may thus detect a value of the charging capacity signal PCHARGE of the auxiliary power-supply circuit 134 according to the divided charging levels CL1 to CL5. In an embodiment, the level detection circuit 133 may use predetermined reference voltages corresponding to respective charging levels so as to identify a charging level of the charging capacity signal PCHARGE. For example, when the charging voltage of the auxiliary power-supply circuit 134 is equal to 89.4% of the maximum voltage, the currently stored energy in the auxiliary power-supply circuit 134 is substantially equal to 80% of the maximum energy. As a result, the level detection circuit 133 generates the charging level detection signal DET indicating the fourth charging level CL4 in response to the charging capacity signal PCHARGE indicative of the currently stored energy corresponding to the 80% of the maximum energy of the auxiliary power-supply circuit 134.

In the embodiment shown in FIG. 4, the maximum capacity of the auxiliary power-supply circuit 134 is divided into five charging levels CL1 to CL5 in units of 20% of the maximum capacity and is then measured according to the five charging levels CL1 to CL5. However, embodiments of the present disclosure are not limited thereto, and the number of the charging levels may vary according to embodiments.

The level detection circuit 133 may generate the charging level detection signal DET in response to the charging capacity signal PCHARGE from the auxiliary power-supply circuit 134. In response to the charging level detection signal (DET), the power-supply controller 131 may generate a charging sense signal CHARGE indicating information on the charging level of the auxiliary power-supply circuit 134 and output the charging sense signal CHARGE to the processor 112 in FIG. 2.

Figure 5:
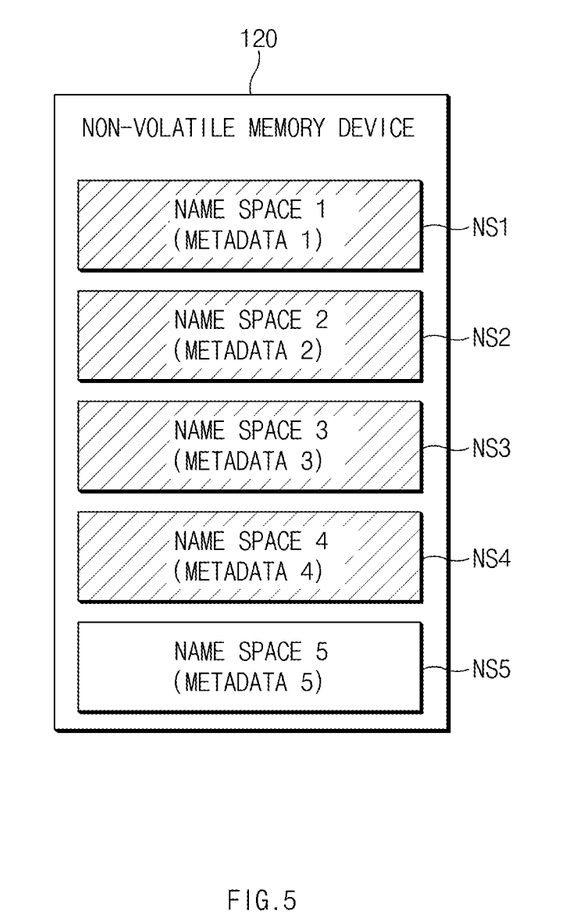
FIG. 5 illustrates operations of each of non-volatile memory devices shown in FIG. 1 according to an embodiment of the present disclosure.

FIG. 5 illustrates operations of each of the non-volatile memory devices 120 shown in FIG. 1 according to an embodiment of the present disclosure.

Referring to FIG. 5, flushing information for system recovery is not all flushed out at once, and is flushed out according to a predetermined unit or according to respective functions. In an embodiment, the flushing information may include a host request address indicating a Logical Block Address (LBA), mapping information, write data, etc.

The host request address may be an LBA, and may denote an address value to be written or read by a host (e.g., the host 10 in FIG. 1). The mapping information may be address information for converting the LBA into a virtual address (VA). A memory controller (e.g., the memory controller 113 in FIG. 2) may convert a logical address received from the host 10 into a physical address using the mapping information stored in a buffer memory (e.g., the buffer memory 115 in FIG. 2). In an embodiment, the mapping information may include a mapping table and metadata. The metadata may denote specific information capable of guaranteeing matching characteristics during operation of an electronic device (e.g., the electronic device 100 in FIG. 1). The metadata may include information indicating an erase state of each block of at least one non-volatile memory device 120 or other information indicating validity of each page of at least one non-volatile memory device 120. The write data may be data which has been received from the host 10 and is then cached in the buffer memory 115.

As can be seen from FIG. 5, flushing information may be classified according to individual metadata. In FIG. 5, metadata may be classified according to logically distinctive units. The logically distinctive units may include, for example, significance of metadata, a management scheme of internal data, a unit of a set of the non-volatile memory devices 120, a stream, a Flash Translation Layer (FTL) instance, a volume, a name space, etc. A controller (e.g., the controller 110 in FIG. 1) may selectively change a plurality of storage regions in which metadata is stored, in response to a charging sensing signal (e.g., the charging sensing signal CHARGE in FIG. 1) corresponding to a charging capacity signal (e.g., the charging capacity signal PCHARGE in FIG. 3) of an auxiliary power-supply circuit (e.g., the auxiliary power-supply circuit 134 in FIG. 3).

Each non-volatile memory device 120 shown in FIG. 5 may allow metadata to be classified and stored according to a plurality of name spaces NS1 to NS5. The plurality of name spaces NS1 to NS5 may partition a single physical memory space of the non-volatile memory device 120 into a plurality of logical address spaces. For example, assuming that the number of charging levels of the auxiliary power-supply circuit 134 is set to five, the five name spaces NS1 to NS5 respectively corresponding to the five charging levels may be used. Although the embodiment of the present disclosure in FIG. 5 shows the name spaces NS1 to NS5 that are classified according to 5 logical address spaces, embodiments of the present disclosure are not limited thereto. For example, the number of name spaces may vary according to embodiments.

Upon receiving a control signal from the memory controller 113, the non-volatile memory device 120 may sort metadata for system recovery into a plurality of portions (or a plurality of groups) METADATA 1 to METADATA 5, and may store the sorted portions METADATA 1 to METADATA 5 of metadata in respective ones of the name spaces NS1 to NS5. In other words, the controller 110 according to an embodiment of the present disclosure may route each of the plurality of portions METADATA 1 to METADATA 5 of metadata to a selected one of the name spaces NS1 to NS5 according to priority information of the plurality of portions METADATA 1 to METADATA 5 of metadata. For example, first to fifth portions METADATA 1 to METADATA 5 of metadata having the highest priority to the lowest priority may be routed to first to fifth name spaces NS1 to NS5, respectively. The memory controller 113 may designate a specific name space from among the plurality of name spaces NS1 to NS5 by a name space identifier (ID), such that an independent storage operation for the designated name space can be performed on a corresponding one of the portions METADATA 1 to METADATA5 of metadata.

In accordance with an embodiment, metadata may be stored in some of among the plurality of name spaces NS1 to NS5, rather than in all the name spaces NS1 to NS5, in response to the charging capacity signal PCHARGE of the auxiliary power-supply circuit 134. Upon receiving the charging sense signal CHARGE from a power-supply device (e.g., the power-supply device 130 in FIG. 1), the controller 110 may perform priority allocation, such that the controller 110 may independently manage and select one or more of the name spaces NS1 to NS5 scheduled to store metadata therein. If desirable, the controller 110 may adjust a service type, a service start time, and a priority of each of one or more portions METADATA 1 to METADATA 5 of metadata, which are supplied from management units of the metadata.

For example, assuming that a value of the charging capacity signal PCHARGE reaches 80% corresponding to the fourth charging level CL4 in FIG. 4, the controller 110 may perform flushing operations on the first to fourth name spaces NS1 to NS4 from among all of the name spaces NS1 to NS5. In contrast, the fifth portion METADATA5 of metadata may not be flushed in the remaining unselected name space NS5, while a read operation can be performed in the remaining name space NS5.

The non-volatile memory device 120 according to an embodiment of the present disclosure may include various non-volatile memory devices, for example, an Electrically Erasable and Programmable ROM (EEPROM), a NAND flash memory, a NOR flash memory, a Phase-Change RAM (PCRAM), a Resistive RAM (ReRAM), a Ferroelectric RAM (FRAM), a Spin Torque Transfer Magnetic RAM (STT-MRAM), etc. In addition, the non-volatile memory device 120 may include a plurality of dies, a plurality of chips, or a plurality of packages. Moreover, the non-volatile memory device 120 may be composed of a single-level cell configured to store 1-bit data in a single memory cell, or may be composed of a multi-level cell configured to store multi-bit data in a single memory cell.

Operations of an embodiment including the above-mentioned constituent elements will be described below in more detail.

A power-supply controller (e.g., the power-supply controller 131 in FIG. 3) may detect a power-supply voltage (e.g., the power-supply voltage HPWR in FIG. 3), may convert the detected power-supply voltage HPWR into an internal voltage (e.g., the internal voltage INTV in FIG. 3), and may transmit the internal voltage INTV to an operation voltage provider (e.g., the operation voltage provider 132 in FIG. 3).

During a normal operation of an electronic device (e.g., the electronic device 100 in FIG. 1), the electronic device 100 may be suddenly powered off due to an occurrence of one or more various issues, for example, an error encountered in a power-supply source, an electrical connection cutoff between the electronic device 100 and the power-supply source, user carelessness, a defect of the electronic device 100, etc. Thereafter, the power-supply controller 131 may detect a level of the power-supply voltage HPWR. If the level of the power-supply voltage HPWR is lower than a predetermined reference level, the power-supply controller 131 may activate a sudden power loss detection signal (e.g., the sudden power loss detection signal SPL_DET in FIG. 3). The sudden power loss detection signal SPL_DET may be provided to a processor (e.g., the processor 112 of the controller 110 in FIG. 2).

In response to the activated sudden power loss detection signal SPL_DET, the processor 112 may cause data and programs in use or in residence to be safely kept through preprocessing for safely stopping the operation of the electronic device 100.

In accordance with one embodiment, the processor 112 may safely keep data in use through a flushing operation in which data stored in a buffer memory (e.g., the buffer memory 115 in FIG. 2) is shifted to one or more non-volatile memory devices (e.g., the non-volatile memory devices 120 in FIG. 1). The processor 112 may perform a preprocessing operation for stopping the operation of the electronic device 100 when sudden power off (SPO) occurs. Thereafter, after completion of performing the preprocessing operation, an auxiliary power-supply circuit (e.g., the auxiliary power-supply circuit 134 in FIG. 1) is discharged so that the electronic device 100 can be stopped.

If power is re-supplied to the electronic device 100 after the occurrence of SPO, it is possible to perform a system recovery using metadata stored in the non-volatile memory devices 120. The controller 110 may output a response signal (e.g., the response signal RES in FIG. 1) to a host (e.g., the host 10 in FIG. 1) through a host interface (e.g., the host interface 111 in FIG. 2) after completion of preprocessing of the processor 112.

The power-supply controller 131 may charge the auxiliary power-supply circuit 134 with a charging power-supply voltage (e.g., the charging power-supply voltage PWR in FIG. 3). If the sudden power loss detection signal SPL_DET is activated during an operation of the electronic device 100, the power-supply controller 131 may cause the electronic device 100 to operate by power charged in the auxiliary power-supply circuit 134.

The power-supply device 130 may perform a Power Loss Protection (PLP) operation in preparation for sudden power stoppage. In this case, the sudden power stoppage may denote an abnormal power-off state, and may indicate that power supplied to the electronic device 100 is cut off when the electronic device 100 does not receive a power-off command. Therefore, after an occurrence of SPO, the electronic device 100 may operate using the auxiliary power-supply circuit 134.

The entire metadata can be stored in the non-volatile memory device 120 when the auxiliary power-supply circuit 134 is sufficiently charged after the occurrence of SPO. For example, the auxiliary power-supply circuit 134 has been fully charged, and then a flushing operation may be performed on the entire metadata. However, it may take a relatively long period of time to store flushing information in the non-volatile memory device 120.

In addition, the charging capacity (e.g., the currently stored energy) of the auxiliary power-supply circuit 134 may not reach a predetermined charging capacity, due to reduction of a booting time or deterioration of the auxiliary power-supply circuit 134. In this case, if sudden power off (SPO) occurs, flushing information for system recovery may not be normally stored in the non-volatile memory device 120. In addition, if the auxiliary power-supply circuit 134 is not fully charged when the electronic device is re-powered on after the SPO has occurred, the controller 110 may not normally process a service request from the host 10.

Therefore, an embodiment of the present disclosure may divide the maximum charging capacity (e.g., the maximum stored energy) of the auxiliary power-supply circuit 134 into a predetermined number of units (or charging levels), and may generate the charging level detection signal DET by detecting one of the charging levels that corresponds to the charging capacity. Moreover, an embodiment of the present disclosure may variably control storage units of the non-volatile memory device 120 in response to the charging sense signal CHARGE.

The controller 110 may perform an inverse operation to calculate an amount of charges to perform the flushing operation in the SPO situation based on metadata storage capacities of individual name spaces NS1 to NS5 of the non-volatile memory device 120. For example, the controller 110 may determine a unit of the flushing operation of the non-volatile memory device 120 based on an amount of stored electric charges of the monitored auxiliary power-supply circuit 134 and an amount of electric charges to perform a flushing operation on each of the name spaces NS1 to NS5. Priorities of the name spaces NS1 to NS5 on which the flushing operation is performed may be pre-allocated to the processor 112.

For example, it is assumed that the charging capacity signal PCHARGE detected by the level detection circuit 133 indicates 80% (or 80% charging capacity) of the maximum capacity of the auxiliary power-supply circuit 134. If the charging capacity of the auxiliary power-supply circuit 134 reaches the 80% of the maximum capacity, the level detection circuit 133 may output a charging level detection signal DET having information on a charging level (e.g., the fourth charging level CL4 in FIG. 4) corresponding to the 80% charging capacity. As a result, the power-supply controller 131 may output the charging sense signal CHARGE indicating the 80% charging level information to the processor 112.

In accordance with one embodiment, when the number of name spaces NS1 to NS5 is set to five, it is assumed that the amount of charges corresponding to the 20% of the maximum capacity of the auxiliary power-supply circuit 134 is needed to flush each of the name spaces NS1 to NS5. Accordingly, in order to flush four name spaces NS1 to NS4, the amount of charges corresponding to the 80% of the maximum charging capacity of the auxiliary power-supply circuit 134 is needed.

According to the related art, if the auxiliary power-supply circuit 134 is not fully charged (e.g., charged with the 80% of the maximum charging capacity) after an occurrence of sudden power off (SPO), a recovery service may not be performed. In contrast, according to an embodiment of the present disclosure, although the auxiliary power-supply circuit 134 is not fully charged, it is possible to flush some name spaces (e.g., the first to fourth name spaces NS1 to NS4), rather than all the name spaces NS1 to NS5.

For example, the processor 112 may control to perform a flushing operation without waiting for a fully-charged state of the auxiliary power-supply circuit 134 during a booting operation. Upon receiving a control signal from the processor 112, the memory controller 113 may perform the flushing operation by storing metadata in some name spaces NS1 to NS4 selected among all the name spaces NS1 to NS5 of the non-volatile memory device 120.

Likewise, if sudden power off (SPO) occurs during an operation of the electronic device 100, the memory controller 113 may perform a flushing operation by storing metadata in some name spaces NS1 to NS4 selected among all the name spaces NS1 to NS5. In accordance with one embodiment, in the remaining unselected name space NS5, a read operation may be performed or the flushing operation may be stopped.

As is apparent from the above description, a power-supply device and an electronic device including the same according to embodiments of the present disclosure may guarantee a reliable operation by variably changing a data storage unit according to an amount of electric charges stored in an auxiliary power-supply circuit.

Those skilled in the art will appreciate that the embodiments may be carried out in other specific ways than those set forth herein without departing from the spirit and essential characteristics of the disclosure. The above-described embodiments are therefore to be construed in all aspects as illustrative and not restrictive. The scope of the disclosure should be determined by the appended claims and their legal equivalents, not by the above descriptions. Further, all changes coming within the meaning and equivalency range of the appended claims are intended to be embraced therein.

Although a number of illustrative embodiments have been described, it should be understood that numerous other modifications and embodiments are possible. Particularly, numerous variations and modifications are possible in the component parts and/or arrangements which are within the scope of the disclosure, the drawings and the accompanying claims.

What is claimed is:

1. A power-supply device comprising:
an auxiliary power-supply circuit configured to generate a signal indicative of a charging capacity;
a level detection circuit configured to divide the charging capacity of the auxiliary power-supply circuit into a plurality of charging levels, detect a level of the charging capacity among the plurality of charging levels, and generate a charging level detection signal corresponding to the detected charging level; and
a power-supply controller configured to generate an internal voltage and a charging power-supply voltage in response to an external power, detect a level of the external power, generate a sudden power loss (SPL) detection signal in a sudden power off (SPO) state using the detected level of the external power, and output a charging sense signal indicating a charging level of the auxiliary power-supply circuit in response to the charging level detection signal.

2. The power-supply device according to claim 1, wherein the charging capacity indicates energy stored in the auxiliary power-supply circuit, and
wherein the level detection circuit detects the level of the charging capacity based on a plurality of reference voltages, the plurality of charging levels being determined based on the plurality of reference voltages.

3. The power-supply device according to claim 1, wherein the auxiliary power-supply circuit includes a supercapacitor.

4. The power-supply device according to claim 1, wherein the auxiliary power-supply circuit includes any one of an aluminum electrolytic capacitor and a polymer tantalum capacitor.

5. The power-supply device according to claim 1, further comprising an operation voltage provider configured to receive the internal voltage, convert the received internal voltage into one or more operation voltages, and output the operation voltages.

6. An electronic device comprising:
a power-supply device configured to generate a sudden power loss (SPL) detection signal in a sudden power off (SPO) state by detecting a level of an external power, generate a charging capacity signal indicative of a charging capacity of an auxiliary power-supply circuit, divide the charging capacity into a plurality of charging levels, detect a level of the charging capacity, and generate a charging sense signal indicating a charging level of the auxiliary power-supply circuit in response to the detected level; and
a controller configured to store flushing information in at least one non-volatile memory device when the SPL detection signal is activated, and variably adjust an amount of storage in the non-volatile memory device in response to the charging sense signal.

7. The electronic device according to claim 6, wherein the controller includes:
a buffer memory configured to store data indicating the flushing information; and
a processor configured to flush a portion of the stored data to the non-volatile memory device when the SPL detection signal is activated, and to store the flushed data in a portion of the non-volatile memory device in response to the charging sense signal.

8. The electronic device according to claim 7, wherein the controller further includes a memory interface configured to control one or more operations of the buffer memory in response to a control signal from the processor.

9. The electronic device according to claim 6, wherein the flushing information includes one or more of a host request address, mapping information, and write data.

10. The electronic device according to claim 9, wherein the mapping information includes one or both of a mapping table and metadata.

11. The electronic device according to claim 6, wherein the controller is configured to classify the flushing information according to metadata types, and store the metadata in a portion of the non-volatile memory device in response to the charging sense signal.

12. The electronic device according to claim 6, wherein the controller is configured to sort metadata into a plurality of groups on the basis of any one of significance, an internal-data management scheme, a set unit of the non-volatile memory device, a flash translation layer (FTL) instance, a volume, and a name space.

13. The electronic device according to claim 6, wherein the controller is configured to store the flushing information in a portion of the non-volatile memory device according to predetermined priority information of the flush information when the charging sense signal is activated.

14. The electronic device according to claim 6, wherein the controller divides a storage space of the non-volatile memory device into a plurality of spaces respectively storing a plurality of groups of metadata, and performs a flushing operation on the non-volatile memory device in the SPO state based on the charging capacity of the auxiliary power-supply circuit and a storage capacity for each of the plurality of groups of metadata.

15. The electronic device according to claim 6, wherein the controller includes:
   a host interface configured to control interfacing with an external host; and
   a user interface configured to control interfacing with a user.

16. The electronic device according to claim 6, wherein the controller includes a memory controller configured to control data input/output (I/O) operations of the non-volatile memory device.

17. The electronic device according to claim 6, wherein the power-supply device includes:
   a level detection circuit configured to divide the charging capacity of the auxiliary power-supply circuit into a plurality of charging levels, detect a level of the charging capacity among the plurality of charging levels, and generate a charging level detection signal indicating the detected level of the charging capacity; and
   a power-supply controller configured to generate the SPL detection signal in the SPO state and generate the charging sense signal in response to the charging level detection signal.

18. The electronic device according to claim 17, wherein the charging capacity indicates energy stored in the auxiliary power-supply circuit, and
   wherein the level detection circuit detects the level of the charging capacity based on a plurality of reference voltages, the plurality of charging levels being determined based on the plurality of reference voltages.

19. The electronic device according to claim 17, wherein the auxiliary power-supply circuit includes a supercapacitor.

20. The electronic device according to claim 17, wherein the auxiliary power-supply circuit includes any one of an aluminum electrolytic capacitor and a polymer tantalum capacitor.

* * * * *